United States Patent [19]

Nakayama

[11] Patent Number: 4,768,205
[45] Date of Patent: Aug. 30, 1988

[54] SWITCHED CAPACITOR ADAPTIVE LINE EQUALIZER

[75] Inventor: Kenji Nakayama, Tokyo, Japan
[73] Assignee: NEC Corporation, Tokyo, Japan
[21] Appl. No.: 834,682
[22] Filed: Feb. 28, 1986
[30] Foreign Application Priority Data Feb. 28, 1985 [JP] Japan .................................. 60-39151

[51] Int. Cl.⁴ .............................................. H04B 3/04
[52] U.S. Cl. ...................................... 375/14; 333/173
[58] Field of Search ............... 333/18, 173; 332/31 R; 375/12, 14, 15; 364/814, 825

[56] References Cited

U.S. PATENT DOCUMENTS 4,408,332 10/1983 Savi ........................................ 375/14
4,607,231 8/1986 Kakayama ........................... 333/173

OTHER PUBLICATIONS

Kuraishi et al., "A Switched Capacitor Adaptive Line Equalizer for a High-Speed Digital Subscriber Loop", 1984 IEEE Custom Integrated Circuit Conference, pp. 264–268.
"Line Equalizer for a Digital Subscriber Loop Employing Switched Capacitor Technology", IEEE Transactions on Communications, vol. COM-30, No. 9, Sep. 1982.

Primary Examiner—Benedict V. Safourek
Attorney, Agent, or Firm—Sughrue, Mion, Zinn, Macpeak & Seas

[57] ABSTRACT

A switched capacitor adaptive line equalizer for use in digital communication system adapted to receive input signals at a plurality of signal rates and to supply equalized output signals. Input signals are sent through a switched capacitor equalizer which includes a low-pass filter in order to control the frequency band of the input signals and a variable gain action which selectively sets a prescribed $\sqrt{f}$ characteristic in response to the output of the low-pass filter. A control circuit responsive to the output of the switched capacitor equalizer and the input signal rate selectively adjusts to the characteristic of the switched capacitor equalizer means. Input signals are processed on a time division basis in two channels of the variable gain section, to select the operating characteristic on one of the channels while another operation is performed on the other channel.

8 Claims, 13 Drawing Sheets

| SIGNAL RATE | 56 Kbits | 9.6 Kbits | 4.8 Kbits | 2.4 Kbits | |
|---|---|---|---|---|---|
| FLAT-AGC 2 | 896.0 Kbits | 153.6 Kbits | 76.8 Kbits | 38.4 Kbits | $f_{51}$ |
| LPF 3 | 896.0 | 153.6 | 76.8 | 38.4 | |
| F-AGC 4 | 224.0 | 38.4 | 19.2 | 9.6 | |
| C-AGC 5,6 | 224.0 | 38.4 | 19.2 | 9.6 | $f_{52}$ |
| SH 7 | 224.0 | 38.4 | 19.2 | 9.6 | |
| ROLL OFF FIL.8 | 448.0 | 153.6 | 76.8 | 38.4 | $f_{53}$ |
| LPF 9 | 896.0 | 537.6 | 537.6 | 537.6 | $f_{54}$ |

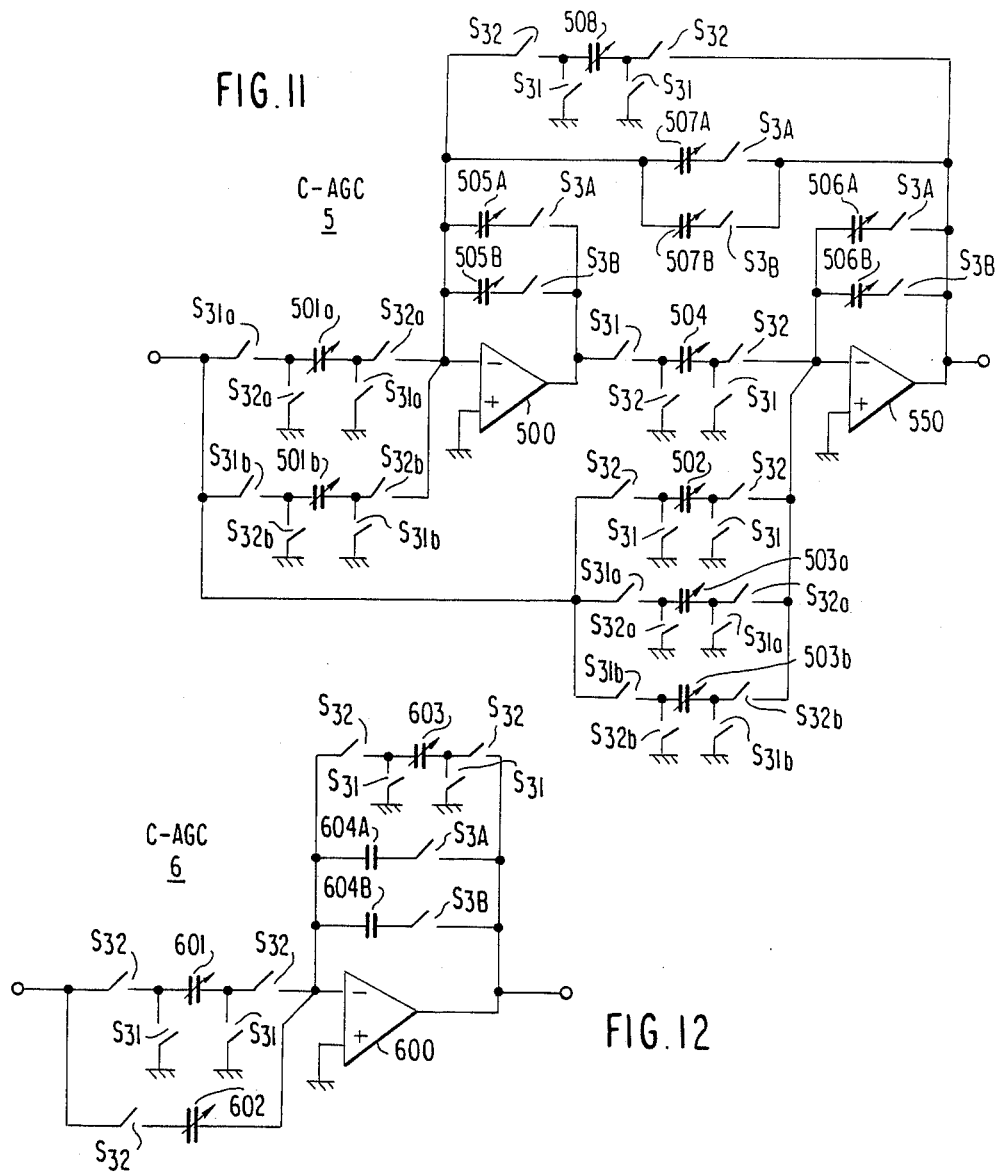
FIG. 11
FIG. 12
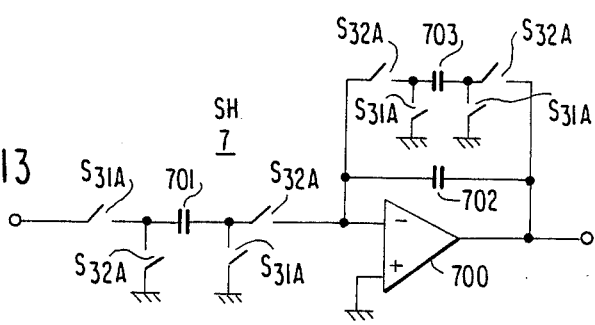
FIG. 13

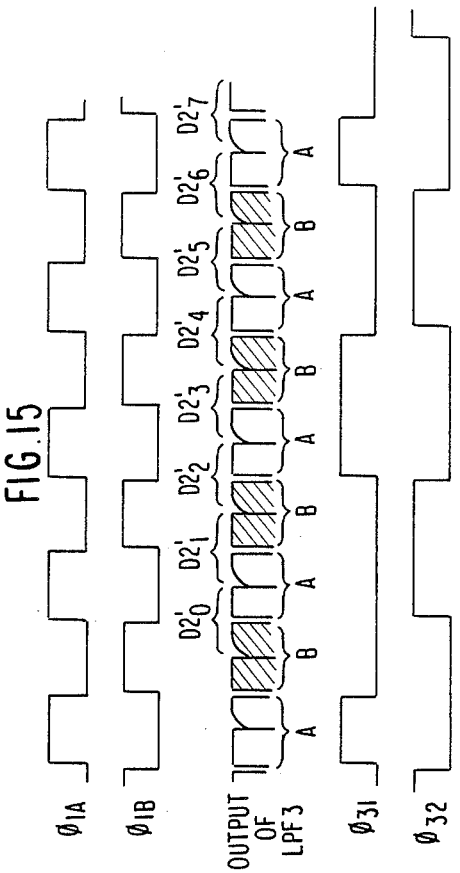
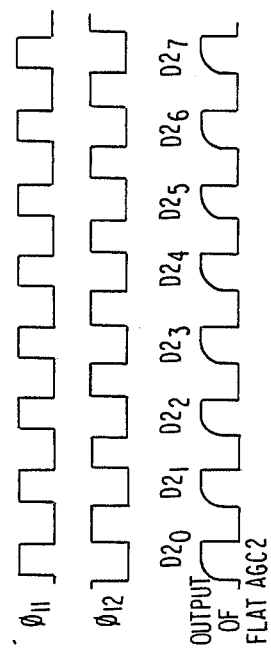
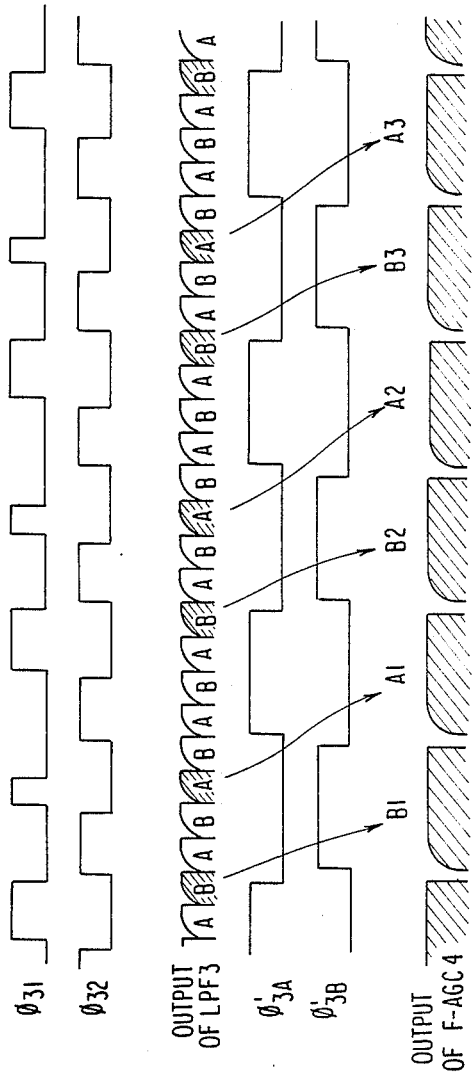

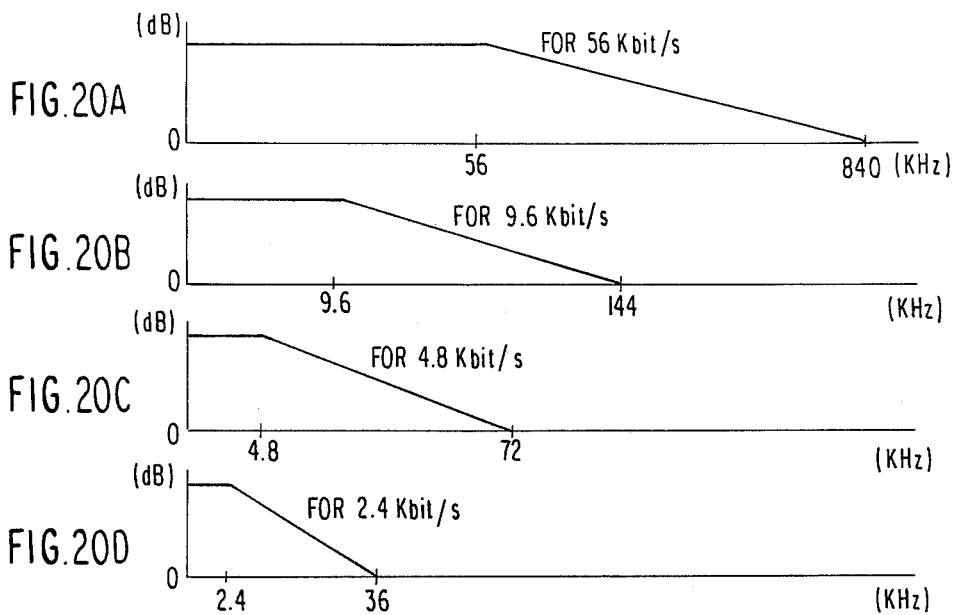
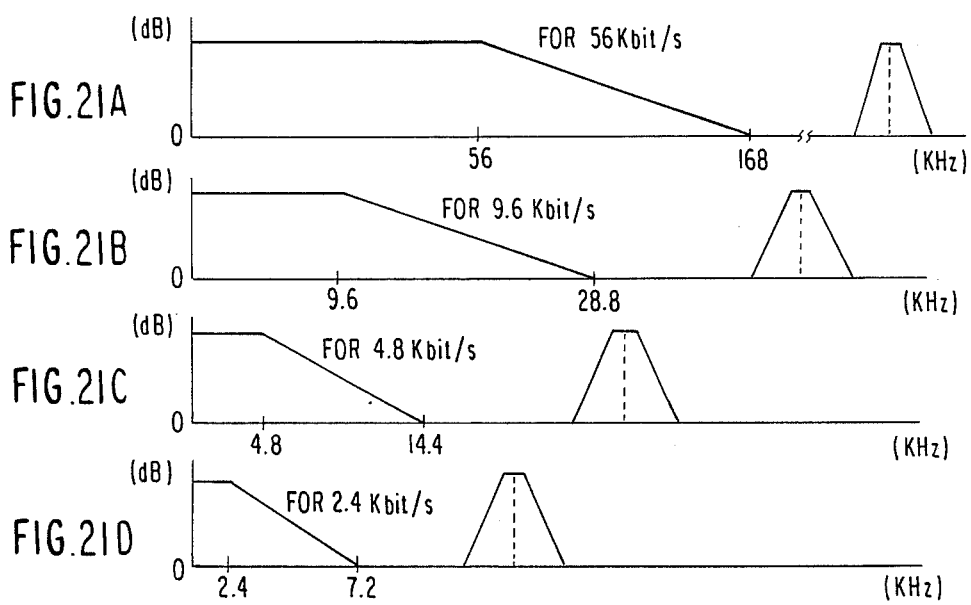

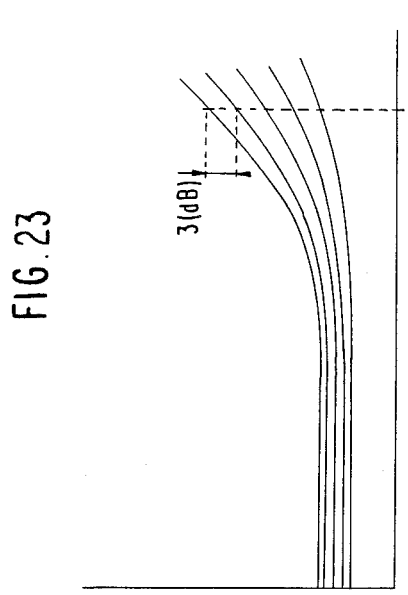
FIG. 23
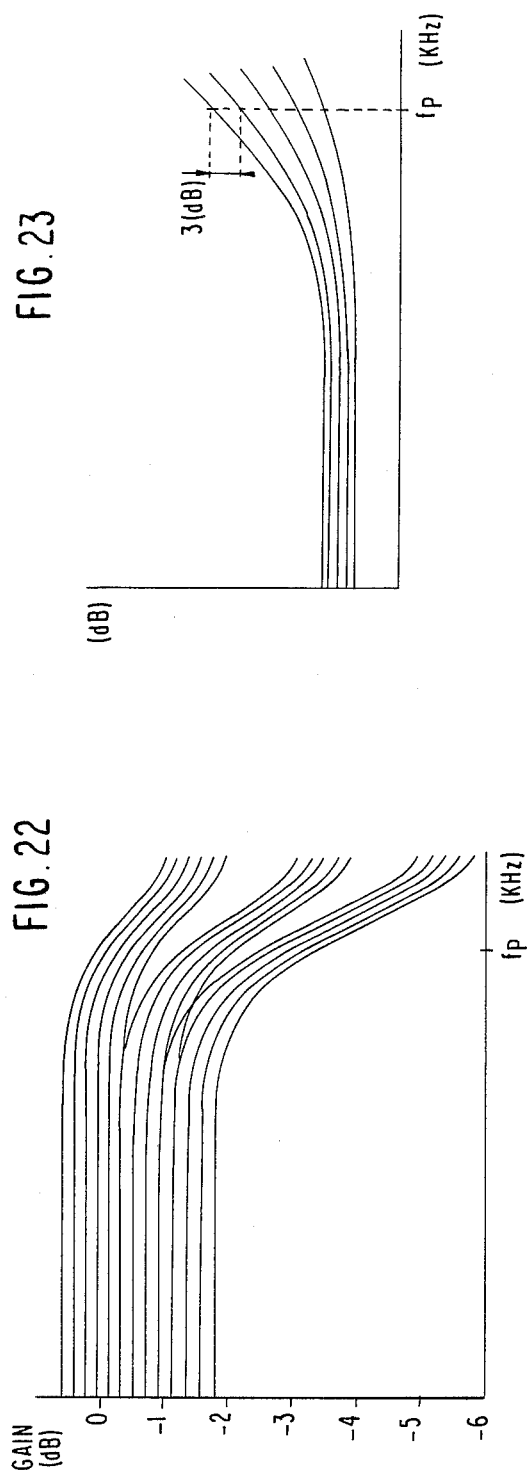
FIG. 22
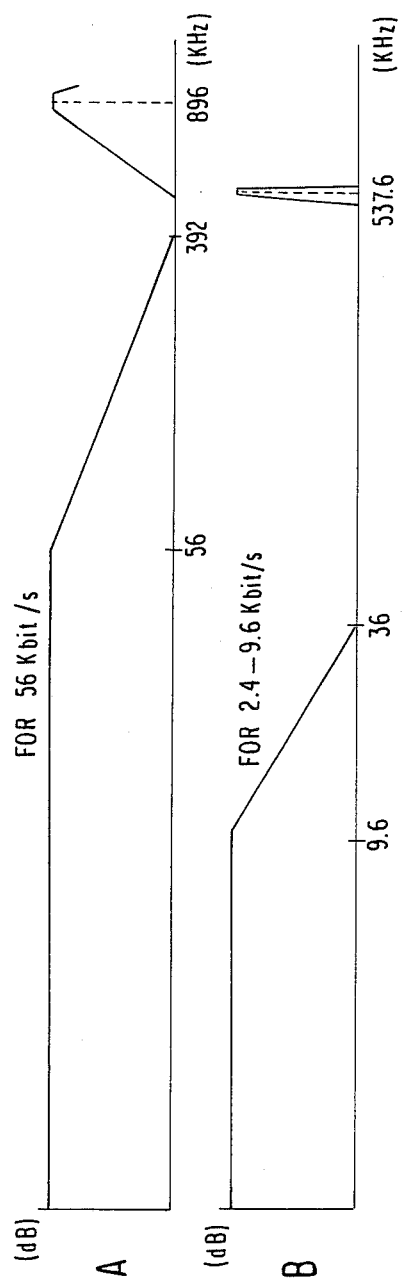
FIG. 25A
FIG. 25B

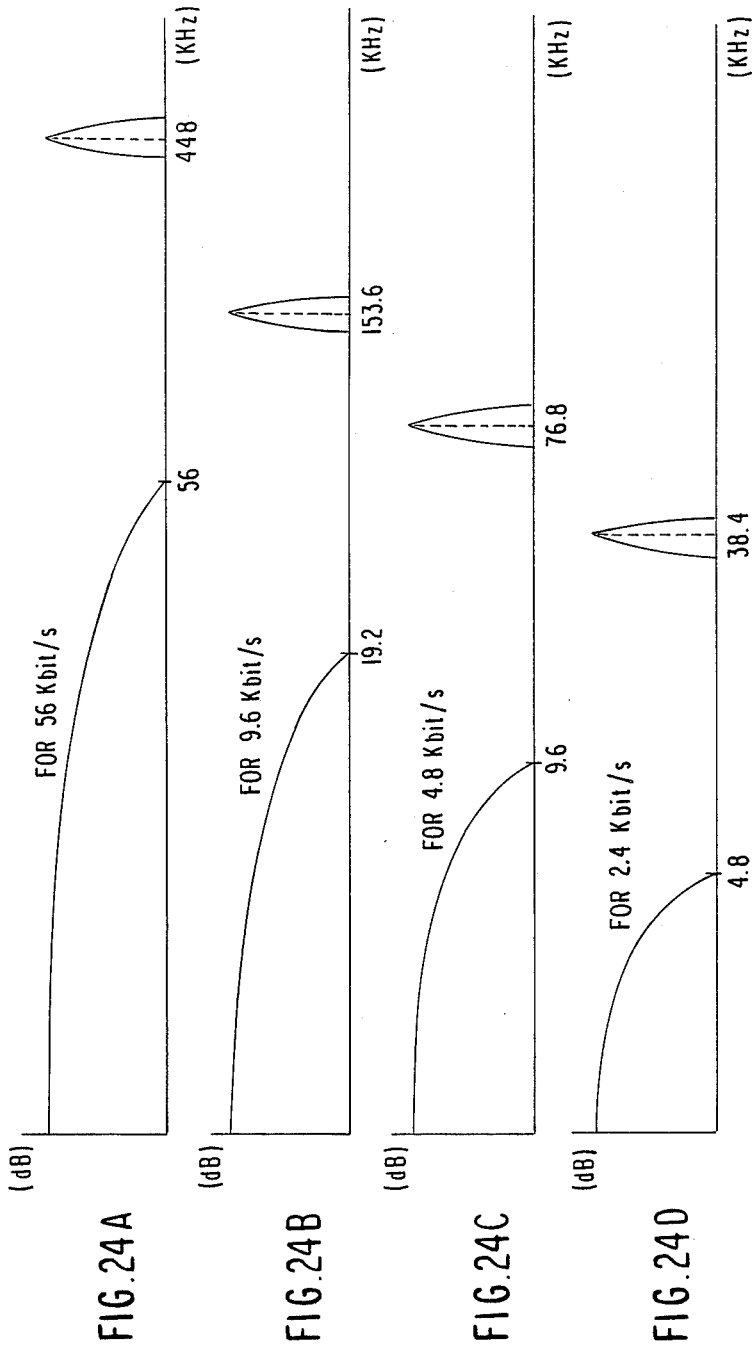

SWITCHED CAPACITOR ADAPTIVE LINE EQUALIZER

BACKGROUND OF THE INVENTION

The present invention relates to a switched capacitor adaptive line equalizer for use in digital communication over four-wire subscriber lines.

Prior art switched capacitor line equalizers (EQLs) using switched capacitor (SC) circuits are proposed in Kuraishi et al., "A Switched Capacitor Adaptive Line Equalizer for a High-Speed Digital Subscriber Loop" (hereinafter referred to as the Kuraishi paper), 1984 IEEE Custom Integrated Circuit Conference, pp. 264–268, and "Line Equalizer for a Digital Subscriber Loop Employing Switched Capacitor Technology", IEEE Transactions on Communications, Vol. COM-30, No. 9, September 1982. According to the Kuraishi paper, the $\sqrt{f}$ characteristic of the SC-EQL is varied by changing the capacitance in an SC filter. For this purpose, a capacitor array having a plurality of branch capacitors connected in parallel with switches is used.

In such an SC equalizer, the gain is usually shared with the $\sqrt{f}$ equalizer section and the other sections which have a capacitor array. For gain adjustment, the capacitance of each capacitor array is changed by switching the switches of each capacitor array. The switchings cause spiked noise and transient phenomena, resulting in a deterioration of the quality of the communication.

Additionally, since two-wire digital communication is a pingpong-like process in which transmission and reception alternately take place, the aforementioned problems will not arise. This is because the capacitances of the line equalizer on the transmitting side may be switched during transmission. Four-wire communication, on the other hand in which signals are constantly received, cannot avoid the adverse effects of noise and transient phenomena, which occur when branch capacitors are selectively switched to set the $\sqrt{f}$ characteristic.

SUMMARY OF THE INVENTION

An object of the present invention, therefore, is to provide a switched capacitor adaptive line equalizer which is completely immune from the influences of noise and transient phenomena occurring when capacitors are switched to set the $\sqrt{f}$ characteristic.

According to the invention, there is provided a switched capacitor adaptive line equalizer adapted to receive input signals at a plurality of signal rates and to supply equalized output signals, and which includes:

A switched capacitor equalizer means made up of a low-pass filter means for controlling the frequency band of the input signals, and variable gain means, responsive to the output of the low-pass filter means, for selectively setting a prescribed $\sqrt{f}$ characteristic; and control means responsive to the output level of the switched capacitor equalizer means and the input signal rate for selectively adjusting the characteristic of the switched capacitor equalizer means. The variable gain means processes the input signals on a time division basis in two channels to produce the processed signals and at the same time selects the characteristic for operation on one of the two channels when another operation is performed on the other.

The low-pass filter means includes: at least one operational amplifier; an input capacitor array means, connected to the operational amplifier and having a plurality of branch capacitors that are switched in response to the output of the control means, in order to select the frequency characteristics; integrating capacitors connected in parallel to said operational amplifier; sampling switching means for sampling the signal charged in the input capacitor array; the time-division switching means switching alternately between the integrating capacitors corresponding to the two channels.

The variable gain means includes: at least one operational amplifier; a capacitor array means, for selecting the $\sqrt{f}$ characteristics connected to the operational amplifier and having a plurality of branch capacitors that are switched in response to the output of the control means, integrating capacitors and sampling capacitor connected in parallel to the operational amplifier; sampling switching means for sampling the signal charged in said input capacitor array and the sampling capacitor; and a time-division switching means for switching alternately between the integrating capacitors corresponding to the two channels.

BRIEF DESCRIPTION OF THE DRAWINGS

The above object, features and advantages of the invention will become more apparent from the following detailed description when taken in conjunction with the accompanying drawings, in which:

FIGS. 11 and 12 are circuit diagrams of different coarse-adjusting automatic gain control circuits (C-AGCs) for use in the EQL of FIG. 1;

FIG. 13 is a circuit diagram of a sample hold circuit (SH) for use in the EQL of FIG. 1;

FIGS. 14 to 18 are timing charts illustrating the operations of the circuits shown in FIGS. 5 to 13, respectively;

FIGS. 20A to 20D are diagrams showing the frequency characteristics of a pre-filter for use in the EQL of FIG. 1;

FIGS. 21A to 21D are diagrams showing the frequency characteristic of the LPF illustrated in FIG. 8;

FIG. 22 is a diagram showing the frequency characteristic of the F-AGC illustrated in FIG. 10;

FIG. 23 is a diagram showing the frequency characteristic of the C-AGC illustrated in FIGS. 11 and 12;

FIGS. 24A to 24D are diagrams showing the frequency characteristic of a roll-off filter for use in the EQL of FIG. 1;

FIGS. 25A and 25B are diagrams showing the frequency characteristic of the LPF 9 for use in the EQL of FIG. 1;

FIG. 27 illustrates an example of a rate change signal generator.

DETAILED DESCRIPTION OF THE PREFERRED EMBODIMENT

Figure 1:
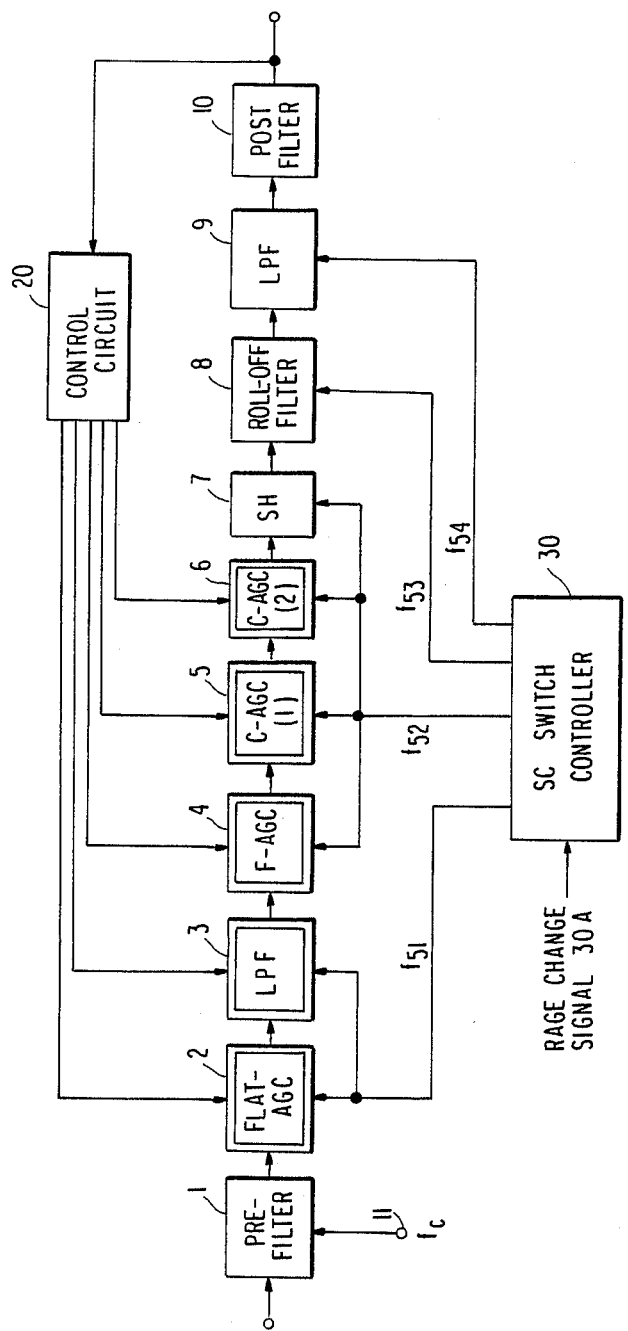
FIG. 1 is a block diagram of a preferred embodiment of the invention.

The present invention will now be described in detail with reference to the drawings. In FIG. 1, an SC-EQL is shown which includes a pre-filter 1 and a post-filter 10, each consisting of an active RC filter having a resistor and a capacitor. The pre-filter serves to anti-alias and the post-filter smooths the waveform. The SC-EQL further includes a flat automatic gain control circuit (Flat-AGC) 2 that has a flat amplitude characteristic with frequency. Also included in the SC-EQL are a fine-adjusting automatic gain control circuit (F-AGC) 4, coarse-adjusting automatic gain control circuits (C-AGC) 5 and 6, a sample hold circuit (SH) 7, a 100% cosine roll-off filter 8, and low-pass filters (LPFs) 3 and 9. Every one of these circuits, except the pre-filter 1 and the post-filter 10, is composed of an switched capacitor (SC) circuit.

The input signal to the pre-filter 1 is a bipolar signal which is obtained by the conversion of binary signals. The binary signals are comprised of high-rate binary signals of 56 kbit/s and low-rate binary signals of 9.6, 4.8 and 2.4 kbit/s. The pre-filter 1 switches and cut-off frequency according to the signal rate and sets one of the frequency characteristics shown in FIGS. 20A to 20D. Terminal 11 receives a control signal which changes the capacitance or resistance to determine the characteristic cut off frequency of the pre-filter 1.

Every circuit from the Flat-AGC 2 through the C-AGC 6 comprises a time division multiplex switched capacitor SC filter (SCF) which is processed on a time division basis. Such an SCF includes at least one operational amplifier, an input capacitor array having a plurality of switched capacitors, a plurality of integrating capacitors, and a plurality of switching elements. The switching elements include sampling switches and time division switches.

Each sampling switch in SCF's is connected to a capacitor or the ground so that a signal to be stored in the capacitor is sampled at the sampling frequency. Each SC filter except the flat-AGC 4 has time-division switches which are connected to the integrating capacitors connected in parallel to the operational amplifier. The time division switches operate alternately to provide two channels in each SC filter. The frequency characteristic of each channel is determined by changing the capacitances and the sampling frequency. The setting of the frequency characteristic for one channel is effected while the other channel is operating.

Figures 2, 3:
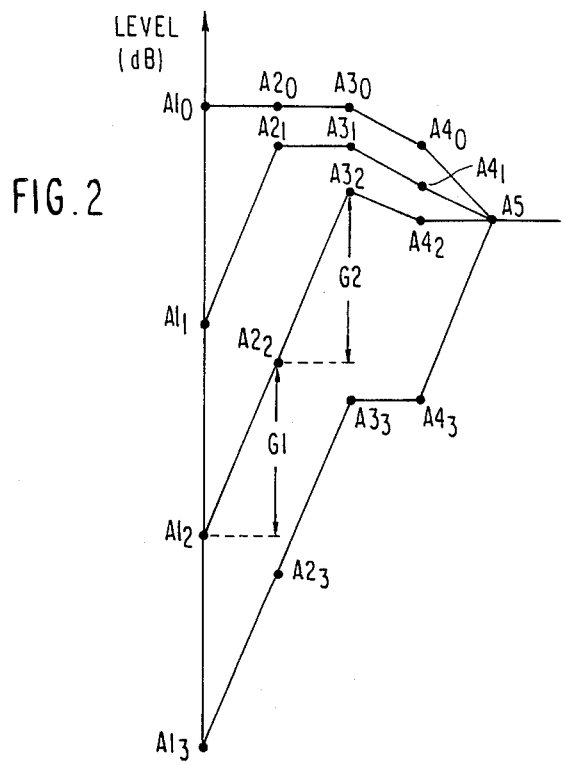
FIG. 2 is a diagram illustrating level setting of the EQL of FIG. 1.
FIG. 3 is a table showing the sampling frequencies of the EQL of FIG. 1.

FIG. 2 is a level diagram of the EQL illustrated in FIG. 1. In FIG. 2, the vertical axis represents the level of the signal, ranging from the maximum of $A1_0$ dB, to the minimum of $A1_3$ dB. The Flat-AGC 2 is able to receive the levels $A1_0$ to $A1_3$ to produce $A2_0$ to $A2_3$; the LPF 3, receives the levels $A2_0$ to $A2_3$ to produce $A3_0$ to $A3_3$; the F-AGC 4 receives the levels, $A3_0$ to $A3_3$, the levels $A4_0$ to $A4_3$. The C-AGC 5 receives $A4_0$ to $A4_3$ and the C-AGC 6 produces the output level of A5 (reference level). The Flat AGC 2 can set its gain at 0 or G1 (dB), and the LPF 3, at 0 or G2 (dB). When the input level is high, the Flat-AGC 2 and the LPF 3 set their respective gains at 0 (dB), and the F-AGC 4, the C-AGCs 5 and 6 adjust their's to align the overall output level to the reference level A5. When the input level is low, the Flat-AGC 2 raises its gain by G1 (dB). If the gain is still not high enough, the LPF 3 will raise its gain by G2 (dB). By distributing the gains as described above, the output level can be maintained at the reference level.

The F-AGC 4 and the C-AGCs 5 and 6 are SC $\sqrt{f}$ equalizers which determine the $\sqrt{f}$ characteristic. The F-AGC 4 can give 16-step variations at about 0.2 (dB) intervals at the Nyquist frequency which is half of the signal rate. The C-AGCs 5 and 6 can do so at about 3 (dB) intervals at the Nyquist frequency. The group delay difference resulting from the coarse $\sqrt{f}$ characteristic switching of the C-AGC 5 is compensated for by the F-AGC 4 to prevent the occurrence of timing jitter or a deterioration in error rate.

FIG. 3 shows the sampling frequencies of the Flat-AGC 2 to LPF 9 referred to in FIG. 1, the frequencies differing with the input signal rate. The Flat-AGC 2 and the LPF 3 sample the input signals at sampling frequency $f_{S1}$ which is 16 times as high as the signal rate. This value corresponds to the quadruple of a sampling frequency $f_{S2}$ at the F-AGC 4 and the C-AGCs 5 and 6. A high sampling frequency $f_{S1}$ can relax the rise characteristic of the pre-filter 1 for anti-aliasing the result of sampling. For this reason, the order of the pre-filter 1 can be lowered. However, if its order is too low, the gain vs. frequency characteristic fall of the LPF 3 will have to be set too steep for anti-aliasing. Therefore, the frequency $f_{S1}$ is set at the optimum value for keeping the orders of the pre-filter 1 and the LPF 3 as low as possible. The sampling frequency $f_{S2}$ of the $\sqrt{f}$ equalizer is set four times as high as each input signal rate (see the Kuraishi paper).

The roll-off filter 8 samples the output of the SH 7 with the sampling frequency $f_{S3}$ and the LPF 9 samples the output of the roll-off filter 8 with the sampling frequency $f_{S4}$.

The flat-AGC 2 through the LPF 9 sample signals by periodically opening and closing sampling switches, each connected to a capacitor. The opening and closing of these switches is controlled by sampling frequency $f_{S1}$, $f_{S2}$, $f_{S3}$ or $f_{S4}$ signal which is generated in a SC switch controller 30.

Figure 4:
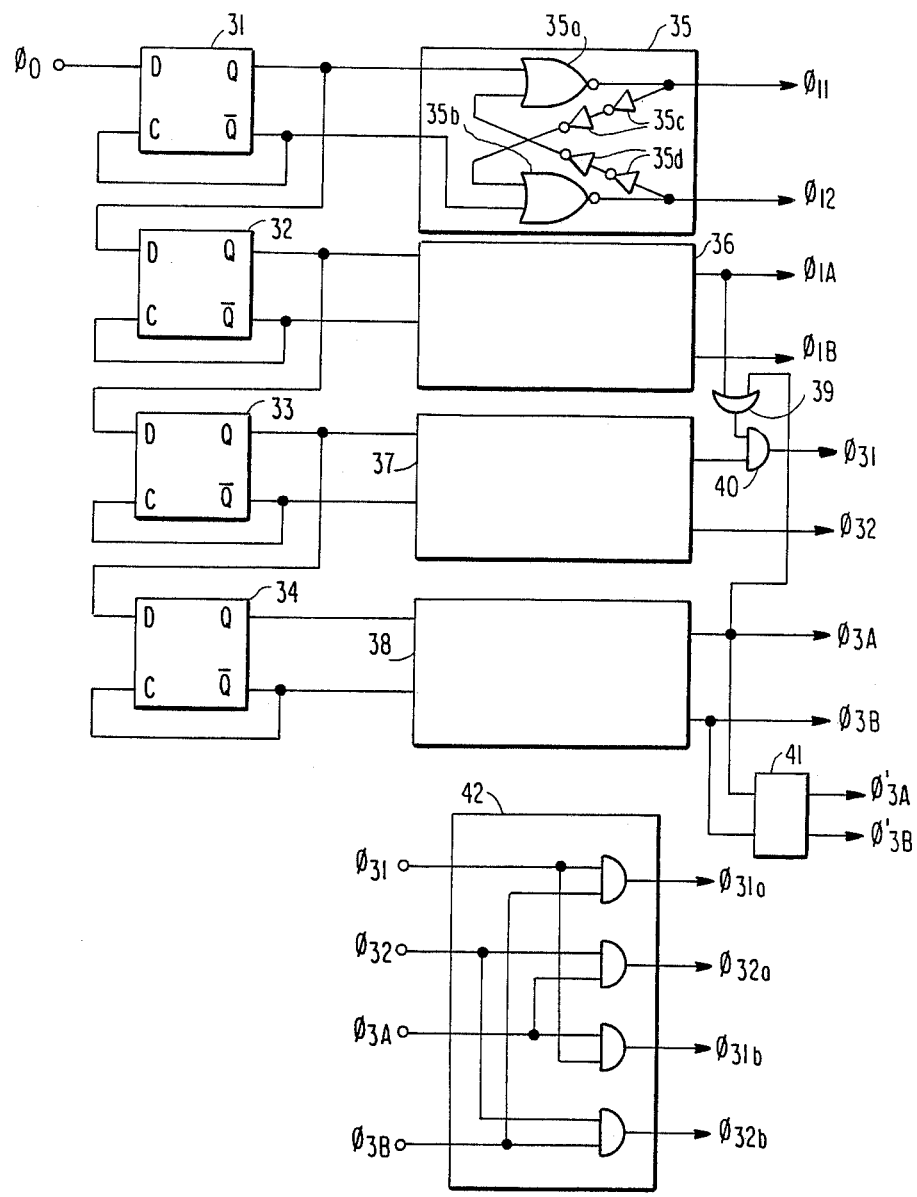
FIG. 4 is a circuit diagram illustrating a SC controller used in the EQL of FIG. 1.
Figure 5:
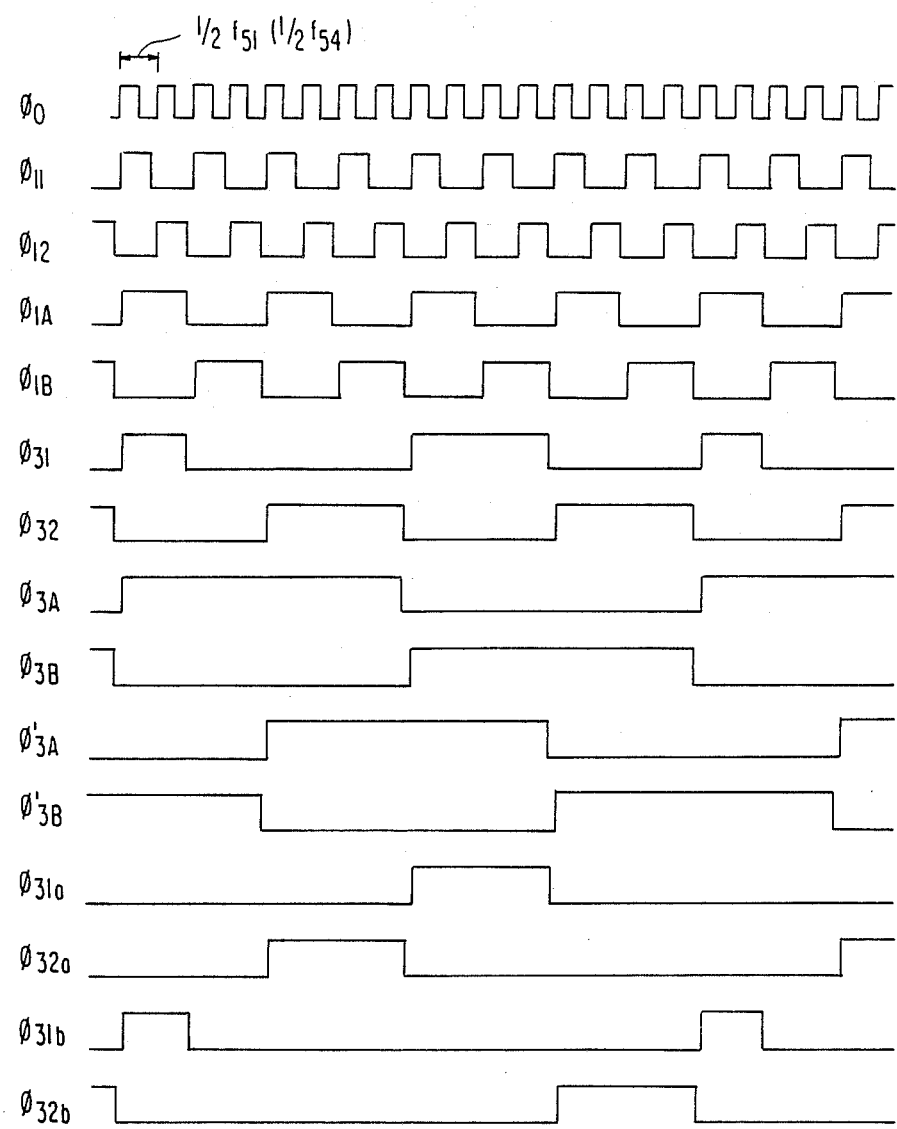
FIG. 5 is a timing circuit of the output signals in FIG. 4.

Referring now to FIG. 4 the SC switch controller 30 includes cascade-connected ½ frequency divider circuits 31, 32, 33 and 34, logic circuits 35, 36, 37 and 38, an OR gate 39, an AND gate 40, a delay circuit 41 and a logic circuit 42. Reference will be made to FIG. 5 together with FIG. 4. Into the ½ frequency divider circuit 31 is entered a master clock signal $\phi_0$ of $2f_{S1}$ in frequency. The clock signal $\phi_0$ alters its frequency according to a rate change signal 30A representing the input signal rate of the equalizer of FIG. 1. If the signal rate is n-fold or 1/n-fold, frequency of the clock signal $\phi_0$ will be n-fold or 1/n-fold, respectively. The logic circuit 35 consists of a NOR gate 35a, one of whose inputs is an output Q of the ½ frequency divider circuit 31; a NOR gate 35b, one of whose inputs is an output $\overline{Q}$; and gates 35c and 35d, which supply the outputs of the NOR gates 35a and 35b to the other input terminals of the NOR gates 35b and 35a, respectively. This logic circuit 35 generates, from the output of the ½ frequency divider circuit 31, clock signals $\phi_{11}$ and $\phi_{12}$ of frequency $f_{S1}$ whose high-level periods do not overlap each other. The logic circuits 36, 37 and 38 are identical with the logic circuit 35, so that $\phi_{1A}$ and $\phi_{1B}$ are respectively the ½ frequency of the clocks $\phi_{11}$ and $\phi_{12}$, and $\phi_{3A}$ and $\phi_{3B}$ are respectively the ¼ frequency of the clocks $\phi_{11}$ and $\phi_{12}$. A signal $\phi_{31}$ is obtained by taking the logical sum of the signals $\phi_{1A}$ and $\phi_{3A}$, and further taking the logical product of this OR output and one of the outputs of the logic circuit 37. The delay circuit 41 supplies clock signals $\phi'_{3A}$ and $\phi'_{3B}$ by delaying the signals $\phi_{3A}$ and $\phi_{3B}$ by one cycle each of the signals $\phi_{1A}$ and $\phi_{1B}$, respectively. The logic circuit 42 generates clock signals $\phi_{31a}$, $\phi_{32a}$ $\phi_{31b}$ and $\phi_{32b}$ from the AND outputs of the signals $\phi_{31}$ and $\phi_{3B}$, $\phi_{32}$ and $\phi_{3A}$, $\phi_{31}$ and $\phi_{3A}$, and $\phi_{32}$ and $\phi_{3B}$ respectively.

The clocks $\phi_{11}$ and $\phi_{12}$, whose frequency is $f_{S1}$, are supplied to the Flat-AGC 2 and the LPF 3, and the clocks $\phi_{31}$ and $\phi_{32}$ of frequency $f_{S2}$, to the F-AGC 4 and the C-AGCs 5 and 6. The clocks $\phi_{1A}$ and $\phi_{1B}$ are intended for channel switching of the LPF 3; the clocks $\phi'_{3A}$ and $\phi'_{3B}$, for channel switching of the F-AGC 4; the clocks $\phi_{3A}$ and $\phi_{3B}$, for channel switching of the C-AGCs 5 and 6; and the clocks $\phi_{31a}$, $\phi_{32a}$, $\phi_{31b}$ and $\phi_{32b}$, for sampling input signals to the C-AGC 5.

Figure 6:
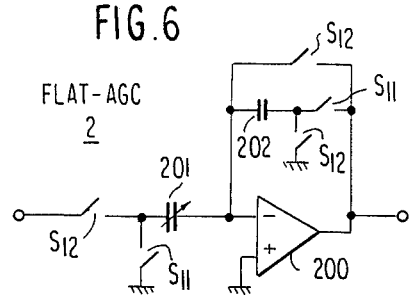
FIG. 6 is a circuit diagram of a flat automatic gain control circuit (Flat-AGC) for use in the EQL of FIG. 1.
Figure 7:
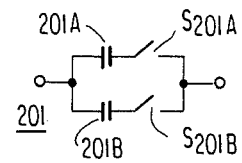
FIG. 7 is a circuit diagram of a programmable capacitor array of FIG. 6.

With reference to FIG. 6, the Flat-AGC 2 includes an operational amplifier 200 and a programmable capacitor array (PCA) 201 connected to the input of the operational amplifier 200, a sampling capacitor 202, and sampling switches $S_{11}$ and $S_{12}$. The PCA 201, as shown in FIG. 7, consists of parallel connection of switched capacitors 201A and 201B. The switching of the capacitors 201A and 201B is effected by switches $S_{201A}$ and $S_{201B}$, serially connected to the respective capacitors 201A and 201B. The switches $S_{201A}$ and $S_{201B}$ are alternately switched in the opposite directions.

The states of the switches determine the capacitance of the SC array which determineds in turn determine the gain of the F-AGC 2, as either O or G1 dB. The sampling switches $S_{11}$ and $S_{12}$ are alternately opened and closed by the clock signals $\phi_{11}$ and $\phi_{12}$ shown in FIG. 5, and sample input signals. When the clock signals $\phi_{11}$ and $\phi_{12}$ are at their respective high levels, the sampling switches $S_{11}$ and $S_{12}$ are closed. FIG. 14 is a timing chart illustrating the operation of the Flat-AGC 2.

Figure 8:
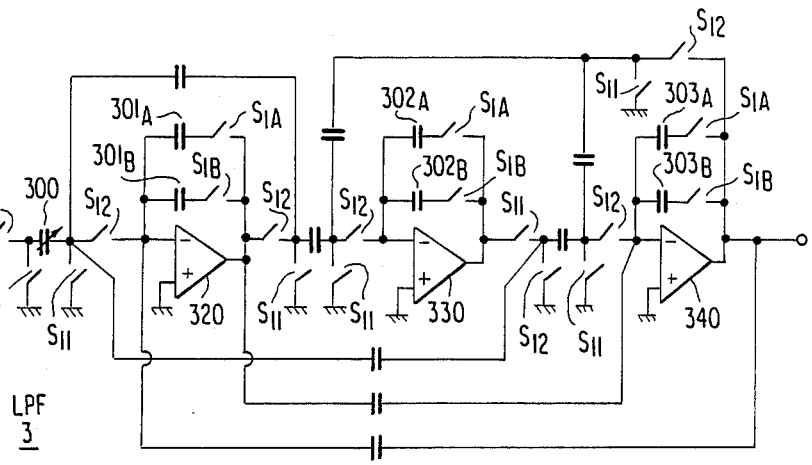
FIG. 8 is a circuit diagram of a low-pass filter (LPF) for use in the EQL of FIG. 1.

Now referring to FIG. 8, the LPF 3 includes operational amplifiers 320, 330 and 340, and a PCA 300. Connected in parallel to these amplifiers are respectively integrating capacitors 301A and 301B, 302A and 302B, and 303A and 303B. Each capacitor of each pair has the same capacitance. The integrating capacitors 301A, 302A, 303A and the integrating capacitors 301B, 302B, 303B are alternately switched by the time-division switches $S_{1A}$ and $S_{1B}$ which are controlled by signals $\phi_{1A}$ and $\phi_{1B}$ shown in FIG. 15 and close only when the signals $\phi_{1A}$ and $\phi_{1B}$ are at their respective high levels. Data $D2_0$, $D2_1$, $D2_3$... supplied from the Flat-AGC 2 are sampled by the signals $\phi_{11}$ and $\phi_{12}$ in the LPF 3 which produces data $D2'_0$, $D2'_1$, $D2'_2$.... The channel formed by the closing of the switch $S_{1A}$ is called Channel A, and that formed by the closing of the switch $S_{1B}$, Channel B.

Figure 9:
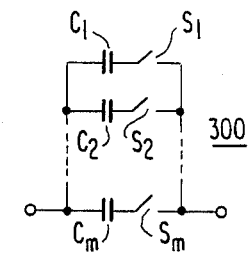
FIG. 9 is a circuit diagram of the programmable capacitor array shown in FIG. 8.

A PCA 300, as illustrated in FIG. 9, consists of m switched capacitors $C_1$ to $C_m$ connected which are in parallel, and are switched by switches $S_1$ to $S_m$ controlled by the control circuit 20 referred to in FIG. 1. The filter characteristic for Channel B is selected when Channel A is on and the filter characteristic for Channel A when Channel B is on, the switching being done when the switch $S_{12}$ is closed. The characteristics of the LPF 3 for the input signal rates of 56, 9.6, 4.8 and 2.4 (kbits/s) are shown in FIGS. 21A to 21D, respectively.

Figure 10:
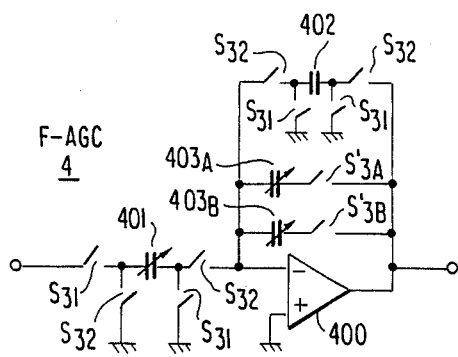
FIG. 10 is a circuit diagram of a fine-adjusting automatic gain control circuit (F-AGC) for use in the EQL line equalizer of FIG. 1.

F-AGC 4, as illustrated in FIG. 10, includes an operational amplifier 400, an input programmable capacitor array (PCA) 401, integrating programmable capacitor arrays (PCAs) 403A, 403B which are switched by time-division switches $S'_{3A}$, $S'_{3B}$, an integrating capacitor 402, and sampling switches $S_{31}$, $S_{32}$. The switches $S'_{3A}$ and $S'_{3B}$ are intended for switching on Channels A and B, respectively. The PCAs 403A, 403B and 401 are similarly structured to the PCA 300 shown in FIG. 9, and are controlled by the control circuit 20. The switches $S_{31}$, $S_{32}$, $S'_{3A}$ and $S'_{3B}$ are controlled by signals $\phi_{31}$, $\phi_{32}$, $\phi'_{3A}$ respectively and $\phi'_{3B}$, and are closed only when the signals are at their respective high levels. As shown is FIG. 16, the signals $\phi_{31}$ and $\phi_{32}$ do not keep their respective high levels simultaneously. Neither do $\phi'_{3A}$ and $\phi'_{3B}$. In Channel A, appropriate branch capacitors of the PCAs 401 and 403B are switched to select the operational characteristic for the next Channel B; in the Channel B, those of the PCAs 401 and 403A are switched to select the operational characteristic for the next Channel A. These selections are performed by the control circuit 20 while branch capacitors of each PCA are discharging. For this selective capacitor switching, the F-AGC 4 usually is not affected by noise or distortion resulting from the switching of the capacitors of each PCA.

The output of the LPF 3 is entered into the F-AGC 4 immediately before the signal $\phi_{31}$ falls to its low level. Therefore, as shown in FIG. 16, the outputs of Channels A and B of the LPF 3 are alternately sampled in a cycle four times as high as that of the LPF 3.

Supposing that the capacitance of the PCA 401 is $C_{401}$, that of the capacitor 402 is $C_{402}$ and that of the PCA 403A or 403B is $C_{400}$, the transfer function H(z) of the F-AGC 4 can be represented by $$H(z) = \frac{C_{401} z^{-1}}{C_{402} + C_{400}(1 - z^{-1})}$$

where $z = e^{j2\pi f/f_{S2}}$ and f is the signal frequency.

FIG. 22 shows an example of the amplitude vs. frequency response of the F-AGC 4. In the figure, the frequency $f_p$ is the Nyquist frequency. Since the input signal rate is halved by bipolar encoding in this embodiment, when the input signal rate is 56, 9.6, 4.8 and 2.4 kbits/s, the frequency $f_p$ is 56, 9.6, 4.8 and 2.4 kHz, respectively. The F-AGC 4 can give 16-step variations at about 0.2 dB intervals at the Nyquist frequency $f_p$. If the input signal rate varies, the sampling frequency $f_{S2}$ will be switched to set the characteristic, but capacitances of the PCAs 403A, 403B and 401 will remain unchanged.

Figure 17:
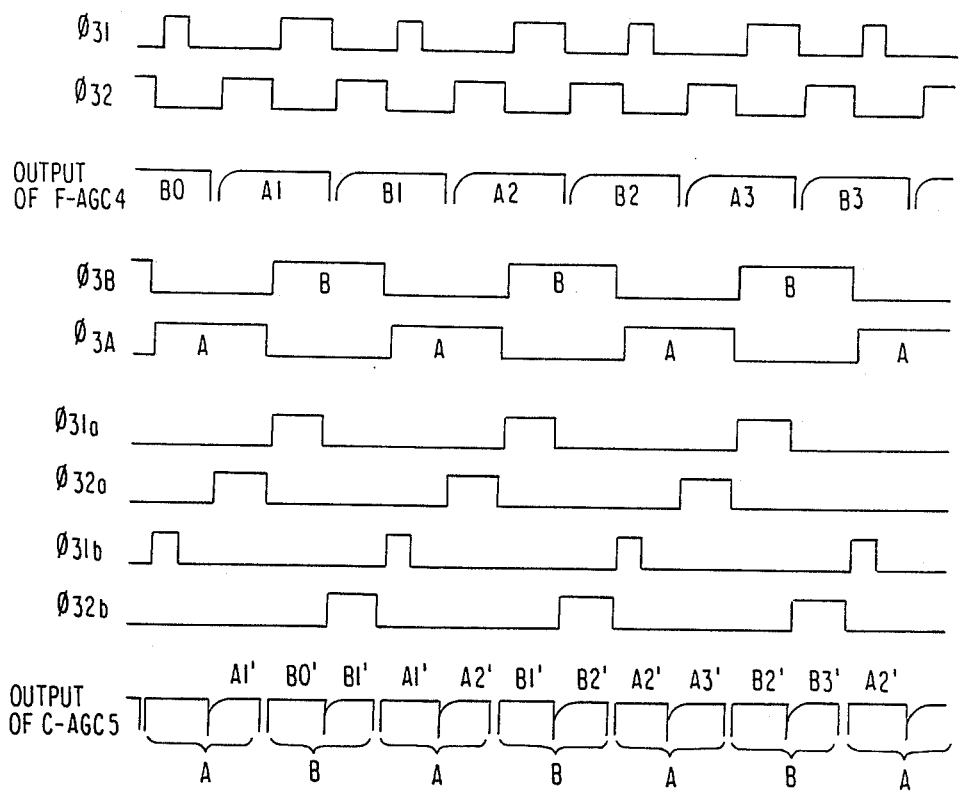

The C-AGC 5, as illustrated in FIG. 11, has operational amplifiers 500 and 550; PCAs 501a and 501b connected to the input side of the operational amplifier 500; PCAs 502, 503a and 503b connected between an input terminal of the operational amplifier 550 and an input terminal of the C-AGC 5; PCAs 505A, 505B, 506A and 506B connected respectively to the feedback loop of the amplifiers 500 and 550; PCAs 504, 507A, 507B and 508; sampling switches $S_{31a}$ and $S_{32a}$ connected to the input and output sides, respectively, of the PCAs 501a and 503a; sampling switches $S_{31b}$ and $S_{32b}$ connected to the input and output sides, respectively, of the PCAs 501b and 503b; sampling switches $S_{31}$ and $S_{32}$ connected to the input and output sides, respectively, of the PCAs 502, 504 and 508; a time-division switch $S_{3A}$ connected to the PCAs 505A to 507A; and a time-division switch $S_{3B}$ connected to the PCAs 505B to 507B. The switches $S_{31a}$, $S_{32a}$, $S_{31b}$, $S_{32b}$, $S_{31}$, $S_{32}$, $S_{3A}$ and $S_{3B}$ are respectively controlled by signals $\phi_{31a}$, $\phi_{32a}$, $\phi_{31b}$, $\phi_{32b}$, $\phi_{31}$, $\phi_{32}$, $\phi_{3A}$ and $\phi_{3B}$. Referring now to FIG. 17, in the C-AGC 5, when the signal $\phi_{3A}$ is at its high level, outputs A0, A1, A2, ... of Channel A from the F-AGC 4 are sampled by the PCA 502 immediately before the signal $\phi_{32}$ falls to its low level, the outputs B0, B1, B2, ... of Channel B are sampled by the PCAs 501b and 503b immediately before the signal $\phi_{31b}$ falls to its low level. When the signal $\phi_{3B}$ is at its high level, outputs A0, A1, ... of Channel A are sampled by the PCAs 501a and 503a immediately before the signal $\phi_{32a}$ falls to its low level, and outputs B0, B1, B2, ... of Channel B are sampled by the PCAs 501b and 503b immediately before the signal $\phi_{32}$ falls to its low level. The sampled inputs to the C-AGC 5, signals A0, A1, ... and B0, B1, B2, ... are outputted as signals A0′, A1′, ... of Channel A and signals B0′, B1′, B2′, ... of Channel B, respectively.

In the Channel A, branch capacitors of each PCA are switched to select the characteristic for operation on Channel B, while in the Channel B the characteristic is selected for operation on Channel A. The selections are performed by the control circuit 20. The point of time at which each PCA performs switching is in the discharging period of the branch capacitors. These switchings are so timed as to eliminate noise and distortion resulting from the change of the capacitance of each PCA.

Supposing that the capacitances of the PCAs 501a or 501b, 502, 503a or 503b, 504, 505A or 505B, 506A or 506B, 507A or 507B, and 508 respectively are $C_{501}$, $C_{502}$, $C_{503}$, $C_{504}$, $C_{505}$, $C_{506}$, $C_{507}$ and $C_{508}$, the transfer function H(z) can be represented by $$H(z) = \frac{C_{505} \cdot C_{502} - (C_{505} \cdot C_{502} + C_{505} \cdot C_{503})z^{-1} + (C_{505} \cdot C_{503} - C_{504} \cdot C_{501})z^{-2}}{C_{505} \cdot C_{506} + (C_{504} \cdot C_{508} + C_{504} \cdot C_{507} - 2C_{505} \cdot C_{506})z^{-1} + (C_{505} \cdot C_{506} - C_{505} \cdot C_{507})z^{-2}}$$

where $z = e^{j2\pi f/fS2}$ and f is the frequency.

The C-AGC 5 sets such a $\sqrt{f}$ characteristic as will give 16-step variations at about 3 (dB) intervals at the Nyquist frequency. FIG. 23 shows the amplitude response at any five steps out of the 16. One of the 16 characteristics is selected by the control circuit 20 according to the degree of the level drop of signals received by the equalizer after having travelled over a transmission path. The C-AGC 5 changes the characteristic to match variations in the input signal rate of the equalizer by switching the sampling frequency $f_{S1}$, but the capacitance switching of each PCA remains unchanged at the low signal rate. As a result, when the input signal rate is 9.6, 4.8 or 2.4 kbits/s, there arises a disparity from the actual $\sqrt{f}$ characteristic. The C-AGC 6 performs the function to compensate for this error in characteristic according to the signal rate.

Figure 18:
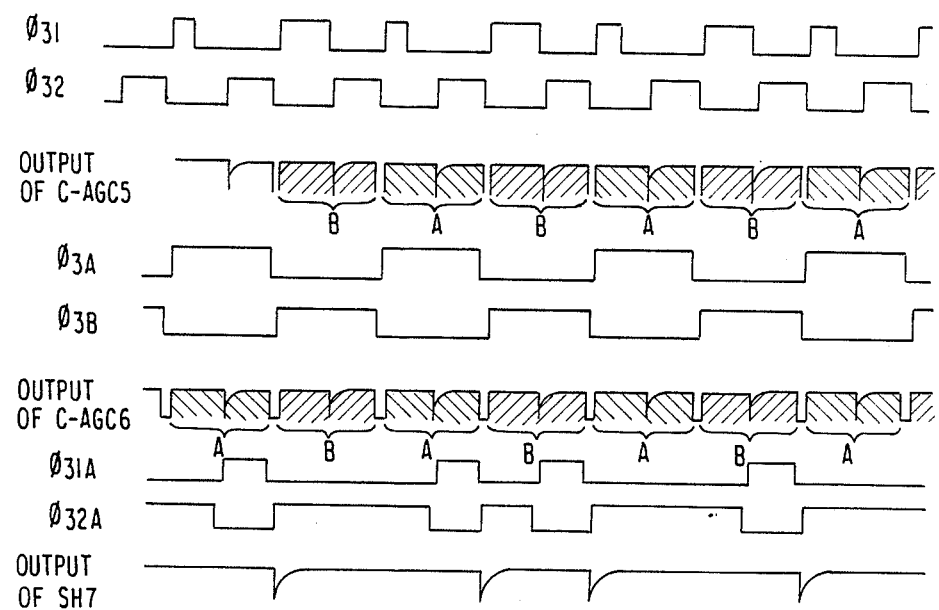

The C-AGC 6, as illustrated in FIG. 12, includes an operational amplifier 600, PCAs 601, 602 and 603 for selecting the frequency characteristic, and integrating capacitors 604A and 604B having equal capacitance. Sampling switches $S_{31}$ and $S_{32}$ and time-division switches $S_{3A}$ and $S_{3B}$ operate simultaneously with the switches $S_{31}$, $S_{32}$, $S_{3A}$ and $S_{3B}$, respectively, used in the C-AGC 5. The C-AGC 6 so operates the PCAs 601, 602 and 603 as to make the amplitude response flat when the signal rate is high (56 kbits/s), because the $\sqrt{f}$ characteristic is already set by the C-AGC 5. When the signal rate is low, the PCAs 601, 602 and 603 are so switched by the control circuit 20 as to compensate for the frequency characteristic set by the C-AGC 5. As shown in FIG. 18, signals of Channels A and B supplied from the C-AGC 5 are outputted via the PCAs 601, 602 and 603 and the integrating capacitor 604A or 604B.

Supposing that the capacitances of the PCAs 601, 602 and 603, and the capacitor 604A or 604B respectively are $C_{601}$, $C_{602}$, $C_{603}$ and $C_{604}$, the transfer function H(z) can be represented by $$H(z) = \frac{-C_{601} - C_{602}(1 - z^{-1})}{C_{603} + C_{604}(1 - z^{-1})}$$

where $z = e^{j2\pi f/f32}$.

The SH 7, as illustrated in FIG. 13, includes an operational amplifier 700, a capacitor 701 to whose input and output sides are respectively connected sampling switches $S_{31A}$ and $S_{32A}$, another capacitor 702, and still another capacitor 703 to whose input and output sides are both connected sampling switches $S_{32A}$. The switches $S_{31A}$ and $S_{32A}$, driven by signals $\phi_{31A}$ and $\phi_{32A}$, sample the output of the C-AGC 6 immediately before the signal $\phi_{31A}$ falls to its low level. As shown in FIG. 18, the signals $\phi_{31A}$ and $\phi_{31B}$ never hold their respective high levels at the same time and their cycles vary only when Channels A and B are switched. The signals of Channels A and B supplied from the C-AGC 6 are sample-held.

As hitherto described, each of the Flat-AGC 2, LPF 3, F-AGC 4, and C-AGCs 5 and 6 performs time division multiplex processing, repeating the action of setting the operating characteristic on one channel while being engaged in another operation on the other. Therefore, none is affected by the waveform distortion occurring when a PCA switches capacitor selection.

Now referring back to FIG. 1, the roll-off filter 8, intended to reduce interference between codes by shaping the output waveform of the sample hold circuit (SH) 7, consists of an ordinary secondary low-pass switched capacitor (SC) filter having amplitude response shown in FIGS. 24A to 24D according to the signal rate. The SC consituting the roll-off filter 8 is actuated by a clock signal of the sampling frequency $f_{S3}$ (see FIG. 3).

The LPF 9, structured similarly to the LPF 3, switches the sampling frequency $f_{S4}$ according to whether the input signal to the equalizer is at its high rate (56 kbits/s) or one of its lower rates (9.6, 4.8 or 2.4 kbits/s). FIGS. 25A and 25B show amplitude responses obtained by capacitance switching.

The post-filter 10, which is a low-pass filter for smoothing the output waveform of the LPF 9, is an analog filter consisting of a resistor and a capacitor.

Figure 26:
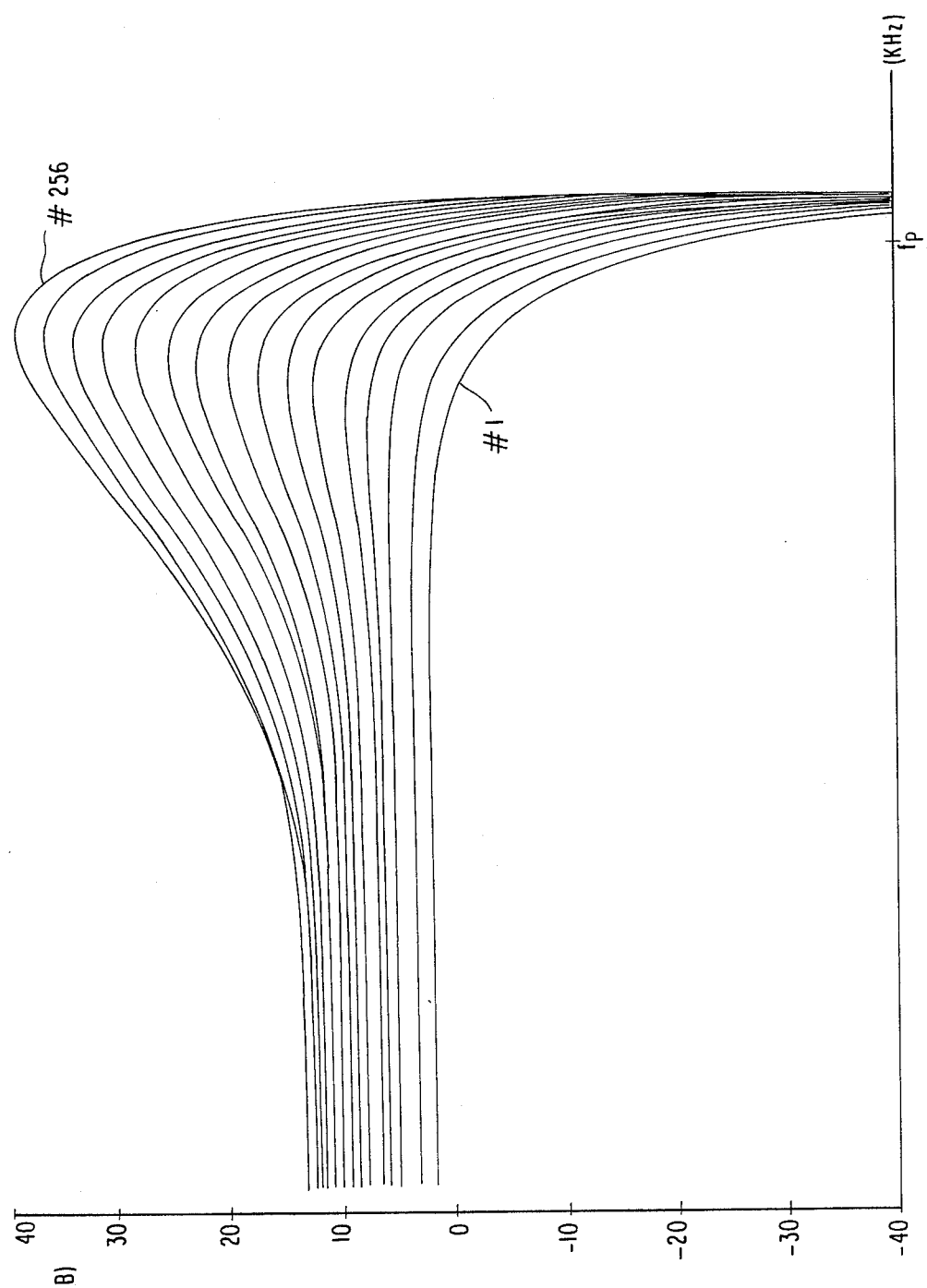
FIG. 26 is a diagram showing the overall characteristic of the preferred embodiment of the present invention.

FIG. 26 shows the overall gain-frequency characteristic of the line equalizer, which is a preferred embodiment of the invention, wherein $f_p$ represents the Nyquist frequency. The $\sqrt{f}$ characteristic can be at any one of 256 steps from #1 through #256.

Figure 19:
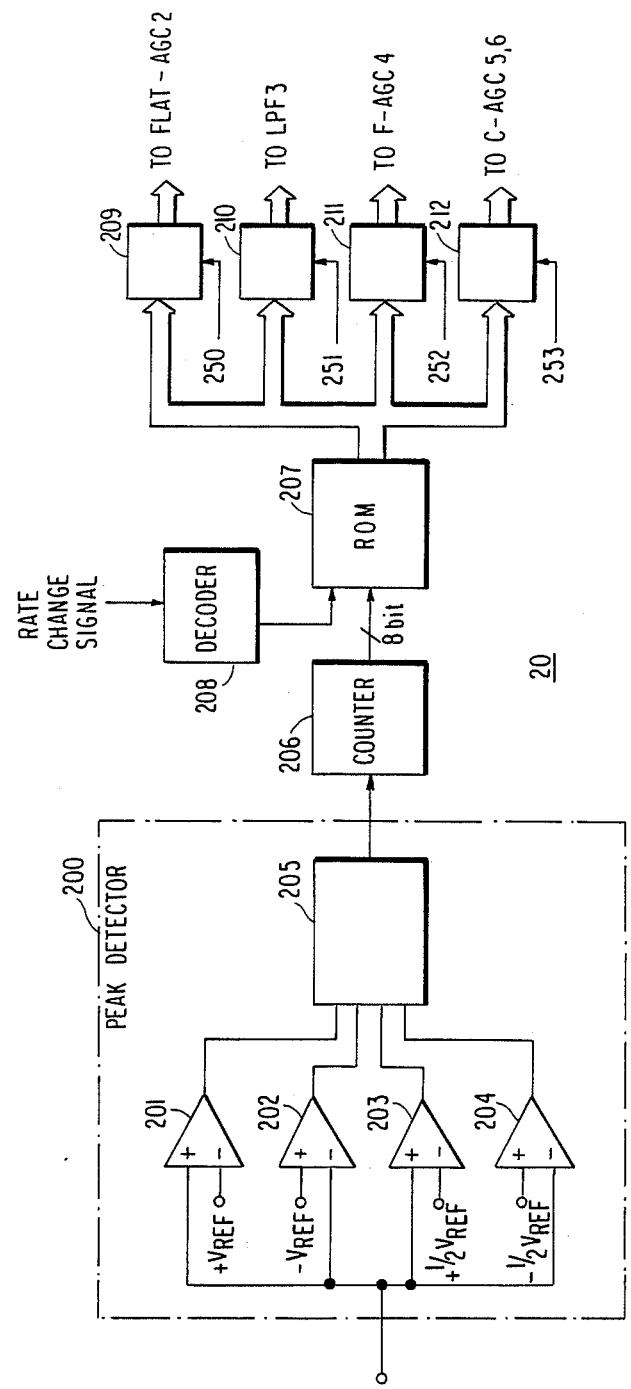
FIG. 19 is a block diagram illustrating a control circuit for use in the EQL of FIG. 1.

Referring now to FIG. 19, the control circuit 20 has a peak detector circuit 200 comprising comparators 201, 202, 203 and 204 and a peak discriminator circuit 205; a counter 206; a read only memory (ROM) 207 for storing the opening-closing data on switches for switching the branch capacitors of the PCAs; a decoder 208; and latches 209, 210, 211 and 212. Each comparator of the peak detector 200 receives bipolar signals supplied from the post-filter 10. The comparators 201 and 202 compare the voltage $V_{10}$ of the bipolar signals with threshold voltages $V_{ref}$ and $-V_{ref}$, respectively, and output "1" when $V_{10}$ is greater than $V_{ref}$ or smaller than $-V_{ref}$. The comparators 203 and 204 compare the voltage $V_{10}$ with threshold voltages $\frac{1}{2} V_{ref}$ and $-\frac{1}{2} V_{ref}$, respectively, and output "1" when $V_{10}$ is greater than $\frac{1}{2} V_{ref}$ or smaller than $-\frac{1}{2} V_{ref}$. The peak discriminator circuit 205 counts the number of occurrences $N_1$ of "1" given by either the comparator 203 or 204, but not both ($V_{ref} > V_{10} > \frac{1}{2} V_{ref}$ or $-V_{ref} < V_{10} < -\frac{1}{2} V_{ref}$), and the number of occurrences $N_2$ of "1" given by the comparators 201 and 202. When $N_1$ reaches K and $N_2/N_1(=K) \geq \frac{1}{2}$, there is generated an output "0" to reduce the counter 206 by +1. When $N_2/N_1(=K) < \frac{1}{2}$, an output "1" is generated to advance the counter 206 by +1. The counter 206, advanced or reduced by 1 according to the output from the peak discriminator circuit 205, supplies eight-bit counting data. There are 256 ($2^8$) different kinds of such counting data, and the counts correspond to the characteristic curves #1 through #256 shown in FIG. 26 on a one-to-one basis. The ROM 207 memorizes signals to control the PCAs in every component from the Flat-AGC 2 to the C-AGC 6 so that a characteristic satisfying one or another of the characteristic curves #1 to #256 can be provided to the equalizer. Since the characteristic curves of FIG. 26 differ with the rate of input signals to the equalizer (whether it is 56, 9.6, 4.8 or 2.4 kbits/s), a control signal is stored in a different address for each signal rate. The decoder 208 receives a rate change signal, discriminates its content and supplies it to the ROM 207, which, in response to this output of the decoder 208, switches according to the signal rate the address designated by the counter 206. The rate change signal indicates the rate of the input signal to the line equalizer and may be generated by manually operating a set of switches. FIG. 27 is a diagram of a simple circuit which may be used to produce the rate change signal. This circuit consists of a set of switches 30 connected to power sources. The outputs of the timing circuits 209, 210, 211 and 212 are supplied to the PCAs of the Flat-AGC 2, LPF 3, F-AGC 4 and C-AGCs 5 and 6, respectively, in synchronization with control signals 250, 251, 252 and 253. Each of these control signals is intended to prescribe the point of time of PCA switching when the operation is on Channel A or B.

As hitherto described, the present invention makes it possible to structure a four-wire adaptive line equalizer out of SC circuits, which are suitable for integration. It also enables the circuit dimensions to be reduced by the use of time division multiplex processing. Furthermore, it makes possible equalization by external control with the same LSI chips for a plurality of signal rates.

What is claimed is:

1. A switched capacitor adaptive line equalizer adapted to receive an input signal and to supply an equalized output signal, comprising:

first switched capacitor filter means responsive to said input signal for limiting a frequency band to be passed and for producing alternately first and second output signals during first and second periods respectively, said first switched capacitor filter means comprising first sampling means, having first switch means and first capacitor means comprised of a first capacitor array, for sampling said input signal at a sampling rate determined in relation to said input signal, and first integrating circuit means including at least a first operational amplifier, first integrating capacitors, and first selecting switch means responsive to said first and second periods for selecting said first integrating capacitors to provide a parallel connection with said first operational amplifier, wherein during said first period, said first capacitor array of said first sampling means is changed in its capacitance to select a low pass filter characteristic for operation for said second period, and during said second period, said first capacitor array is changed in its capacitance to select another low pass filter characteristic for operation for said first period;

a second switched capacitor filter means for providing said first and second output signals with a variable gain which increases with the square root of frequency and is variable depending upon said first and second output signals and for producing alternately third and fourth output signals during third and fourth periods respectively, said second switched capacitor filter means comprising second sampling means, having second switch means and second capacitor means comprised of a second capacitor array, for sampling said first and second output signals at a sampling rate determined in relation to said input signal, and second integrating circuit means including at least a second operational amplifier, second integrating capacitors and second selecting switch means responsive to said third and fourth periods for selecting said second integrating capacitors to provide a parallel connection with said second operational amplifier, wherein during said third period, said second filter means produces said third output signal responsive to said second output signal, the capacitance of said second capacitor array of said second sampling means being changed to select another gain for operation during said third period;

sample and hold means for sampling said third and fourth output signals outputted from said second switched capacitor filter means;

output means for shaping an output waveform of said sample and hold means to produce an output signal of said output means;

first control means responsive to said output signal of said output means for controlling the capacitance of any of said first and second capacitor arrays and said second integrating capacitors; and second control means responsive to a signal indicating an input signal rate for controlling said first and second sampling means.

2. The switched capacitor adaptive line equalizer as claimed in claim 1, wherein said second control means comprises
- a switched capacitor switch controller responsive to the input signal rate of said equalizer, for supplying clock signals of different frequencies to the different elements of said switched capacitor equalizer.

3. The switched capacitor adaptive line equalizer as claimed in claim 2, in which said first control circuit comprises:
- a peak detector;
- a counter for designating an address;
- a decoder for indicating the rate of input signals to said switched capacitor line equalizer and discriminating the contents of said signals in response to said input signal rate;
- a read only memory for storing data for changing the capacitance of said first and second capacitor arrays and said second integrated capacitor in said first and second switched capacitor filter means, responsive to said decoder and said counter; and
- timing circuits for prescribing when first and second switched capacitor filter means are operated on either one of said first and second periods and on either one of said third and fourth periods, respectively.

4. The switched capacitor adaptive line equalizer as claimed in claim 2, in which said switched capacitor switch controller further comprises:
- a plurality of cascade-connected ½ frequency divider circuits;
- a plurality of logic circuits, equal in number to said ½ frequency divider circuits and having the outputs of said ½ frequency divider circuits as respecitive inputs;
- an OR gate;
- an AND gate;
- a delay circuit; and
- a logic circuit.

5. A switched capacitor adaptive line equalizer as claimed in claim 1, wherein said second integrating capacitors of said second switched capacitor filter means include a third capacitor array.

6. A switched capacitor adaptive line equalizer as claimed in claim 6, wherein said third capacitor array includes means for changing the capacitance thereof with the switching of said second capacitor array of said second sampling means.

7. The switched capacitor adaptive line equalizer as claimed in claim 1, in which said second switched capacitor filter means further comprises:
- a fine-adjusting automatic gain control circuit having the output of said first switched capacitor filter means as an input;
- a first coarse-adjusting automatic gain control circuit having the output of said fine-adjusting automatic gain control circuit as an input; and
- a second coarse-adjusting automatic gain control circuit having the output of said first coarse-adjusting automatic gain control circuit as an input.

8. The switched capacitor adaptive line equalizer as claimed in claim 7, in which said output means further comprises:
- a roll-off filter having the output of said sample and hold circuit as an input; and
- a second low-pass filter having the output of said roll-off filter as an input.

* * * * *

UNITED STATES PATENT AND TRADEMARK OFFICE
CERTIFICATE OF CORRECTION

PATENT NO. : 4,768,205
DATED : August 30, 1988
INVENTOR(S) : Nakayama

It is certified that error appears in the above-identified patent and that said Letters Patent is hereby corrected as shown below:

COLUMN 2, LINE 37    Delete "circuit" insert --chart--;

COLUMN 4, LINE 2     "After "$A3_3$" (second instance) insert --to produce--;

COLUMN 5, LINE 42    Delete "determineds"

COLUMN 12, LINE 12   Delete "Claim 6" insert --Claim 5--;

Signed and Sealed this

Thirtieth Day of May, 1989

Attest:

DONALD J. QUIGG

Attesting Officer

Commissioner of Patents and Trademarks